United States Patent
Dancea

(10) Patent No.: US 7,047,166 B2
(45) Date of Patent: May 16, 2006

(54) METHOD AND VLSI CIRCUITS ALLOWING TO CHANGE DYNAMICALLY THE LOGICAL BEHAVIOR

(75) Inventor: Ioan Dancea, Aylmer (CA)

(73) Assignee: Ioan Dancea, Batineau (CA)

(*) Notice: Subject to any disclaimer, the term of this patent is extended or adjusted under 35 U.S.C. 154(b) by 757 days.

(21) Appl. No.: 09/874,027

(22) Filed: Jun. 6, 2001

(65) Prior Publication Data
US 2002/0173938 A1    Nov. 21, 2002

(30) Foreign Application Priority Data
Feb. 27, 2001  (CA) .................................. 2338458

(51) Int. Cl.
*G06F 7/60* (2006.01)
*G06F 7/38* (2006.01)

(52) U.S. Cl. .............................. 703/2; 703/13; 703/14; 703/15; 708/232; 716/12; 716/17; 716/18; 326/38; 326/39; 326/40; 326/41

(58) Field of Classification Search ................. 703/2, 703/13, 14, 15; 716/12, 17; 708/232, 603; 326/38–41; 327/144, 145
See application file for complete search history.

(56) References Cited

U.S. PATENT DOCUMENTS

| | | | | |
|---|---|---|---|---|
| 4,931,671 A | * | 6/1990 | Agrawal | 326/40 |
| 5,121,006 A | * | 6/1992 | Pedersen | 326/38 |
| 5,220,214 A | * | 6/1993 | Pedersen | 326/38 |
| 5,220,215 A | * | 6/1993 | Douglas et al. | 326/39 |
| 5,309,046 A | * | 5/1994 | Steele | 326/39 |
| 5,361,373 A | | 11/1994 | Gilson et al. | |
| 5,963,048 A | * | 10/1999 | Harrison et al. | 326/39 |
| 5,995,744 A | | 11/1999 | Guccione et al. | |
| 6,034,546 A | * | 3/2000 | Jones et al. | 326/39 |
| 6,091,892 A | * | 7/2000 | Xue et al. | 716/12 |
| 6,212,670 B1 | * | 4/2001 | Kaviani | 716/17 |
| 6,288,566 B1 | * | 9/2001 | Hanrahan et al. | 326/38 |
| 6,298,472 B1 | * | 10/2001 | Phillips et al. | 716/18 |
| 6,311,200 B1 | * | 10/2001 | Hanrahan et al. | 708/232 |

(Continued)

OTHER PUBLICATIONS

"Hybrid Product Term and LUT Based Architectures Using Embedded Memory Blocks", F. Heile, FPGA '99, ACM 1-58113-088 0/99/02, ACM 1999.*

(Continued)

*Primary Examiner*—Fred Ferris

(57) ABSTRACT

A method, named the product terms method that allows to implement and/or to change dynamically the logical behavior of any combinational or synchronous sequential circuits has been presented. The method uses for every product term of logical equations, expressed as a sum-of-product, three memory words: mask word, product word and function word. The words of all product terms are ranged in a table, which characterize the logical behavior of the circuit.

The invention provides the hardware structure of several new types of VSLI circuits, having re-configurable logic behaviors. A first embodiment implements any type of multiple output combinational circuit, a second embodiment implements any synchronous sequential circuit with only clock input and, a third embodiment implements any synchronous sequential circuit s with data inputs and clock input.

An expert system capable to generate the tables used for the product terms method by interpreting and analysing the logical equations either supplied by the user or found in a database is also provided.

12 Claims, 13 Drawing Sheets

U.S. PATENT DOCUMENTS

| | | | | |
|---|---|---|---|---|
| 6,438,569 B1 * | 8/2002 | Abbott | ................ | 708/603 |
| 6,480,023 B1 * | 11/2002 | Kaviani | ................ | 326/38 |
| 6,662,323 B1 * | 12/2003 | Ashar et al. | ................ | 714/724 |
| 6,754,686 B1 * | 6/2004 | Kaviani | ................ | 708/232 |
| 6,791,355 B1 * | 9/2004 | Vergnes | ................ | 326/41 |

OTHER PUBLICATIONS

Ioan Dancea "Dynamically Changing the Logical Behavior of a Micocomputer Interface", IEEE MICRO, Apr. 1989, pp. 39-51.

* cited by examiner

METHOD AND VLSI CIRCUITS ALLOWING TO CHANGE DYNAMICALLY THE LOGICAL BEHAVIOR

BACKGROUND OF THE INVENTION

1. Field of Invention

This invention is directed to logically modifiable VLSI digital circuits, and more specifically to combinational and synchronous sequential circuits that may be dynamically configured and re-configured to perform a digital function of choice.

2. Related Art

Digital circuits are realised with integrated circuits. An integrated circuit, called chip, contains electrical components such as transistors, diodes, resistors and capacitors. The various components are interconnected inside the chip to form gates and memory elements.

A combinational circuit (CC) is obtained using exclusively elementary gates (NOT, OR, AND, XOR, NOR, etc.). Each combinational circuit have a hardware structure designed to perform definite functions, as specified by logical equations. Consequently, there is a specific hardware structure for a 3 to 8 decoder, another hardware structure for a 4 bits comparator, and so on.

Sequential circuit, and the invention considers only the synchronous sequential circuits (SSC), contains gates and memory elements. Information is charged in memory elements to establish the initial state or the next state of the circuit. The model of synchronous sequential circuit in which the outputs depend on both the input variables and the state variables is called Mealy machine model. In another model of synchronous sequential circuit, called Moore machine model, the outputs depend only on the state variables. It is always possible to convert from one representation of synchronous sequential model to the other. For the purpose of the invention, any synchronous sequential circuit is represented as a Moore machine. FIG. 1 illustrates the Moore machine model, where combinational circuit 10 determines the next state stored in the memory part 25, and combinational circuit 20 determines the outputs. In the general case, combinational circuit 10 is defined by equations including both, input variables and state variables. As it is known, an important number of usual synchronous sequential circuits define their next state by logical equations that use only the state variables, without considering any input variable, except the clock. For example, all the counters have this structure. The nature of the logical flip-flops used in the memory part 25 influences the structure of combinational circuit 10 and/or 20. The simplest solution for the memory part 25 uses D synchronous flip-flops. Like combinational circuits, each synchronous sequential circuit has its own hardware structure. Thus, there is a specific hardware structure for an 8 bits synchronous binary counter, another hardware structure for a 6 bits pseudo-random generator, and so on.

As the digital technique advanced, the design of circuits was realised by developing VLSI (very large scale integrated) technologies. A general digital VLSI circuit consists of logic functional blocks and memory elements, which are interconnected by connection lines to perform a specific task (for example a VLSI processor). Many real applications need to configure a specific logical structure, or to be able to change dynamically an initial structure, consequently the ability to cover a re-configurable logical behavior. These kinds of applications use programmable VLSI logic devises. Programmable logic devices have progressed from simple group of gates to very complex Field Programmable Gate Arrays (FPGAs), which have a large number of inputs and outputs, memory elements, programmable logic blocks, tracks for interconnecting the logical blocks to each other and to inputs and outputs. The FPGA's are used to implement or to modify structures with a high number of logic functions, which result in lower part counts, lower power dissipation, higher speed of operation and greater flexibility than if discrete components are used.

Using the conventional programmable VLSI circuits, to realise a particular logical structure or to modify such a structure and implicitly its logical behavior, requires, for any combinational or synchronous sequential complex circuit, a programming effort and a dedicated programmable device. Consequently, a separate program is needed each time such a particular circuit is implemented, or modified in hardware. In addition, for complex circuits the developer must add the logic part for testing the functional structure of the circuit, which takes a large surface of the real estate.

SUMMARY OF THE INVENTION

The present invention seeks to overcome the disadvantages of the prior art associated with digital programmable VLSI circuits.

It is an object of the present invention to provide a method, named the product terms method, which allows the implementation, by software and/or by hardware, of multiple output combinational circuits and synchronous sequential circuits.

It is another object of the present invention to provide the hardware structure of several new types of VSLI circuits, having re-configurable logic behaviors. A first embodiment of the invention can implement any type of multiple output combinational circuit, a second embodiment can implement any synchronous sequential circuit with only clock input and, a third embodiment can implement any synchronous sequential circuits with data Inputs and clock input, known as Moore machine model.

It is another object of the present invention to provide an expert system capable to generate the tables used for the product term method by interpreting and analysing the logical equations either supplied by the user or found in a database.

According to one aspect of the invention a VLSI circuit for implementing in hardware any multiple output combinational circuit is provided, having m inputs, r outputs and the behaviour expressed in logical sum-of-product equations with n product terms p(k). This VLSI circuit comprises a register with m bits for storing the input variables, n basic cells, where a cell C(k) is used for determining the logical value of a product term p(k) of the equations for given inputs, and a logical summing circuit, realised with r OR gates, each one with n inputs, associated with the cell C(k) for receiving the logical value of product terms p(k) and outputting the r bits of output functions.

According to another aspect of the invention a VLSI circuit for implementing in hardware any synchronous sequential circuit with clock input only and outputs taken from the state register is provided, having the next state functions expressed in logical sum-of-product equations with and n product terms p(k). This VLSI circuit comprises a clock input, a state register with m bits for storing the state variables, n basic cells, where a cell C(k) is used for determining the logical value of a product term p(k) of the equations for the next state, a logical summing circuit, realised with m OR gates, each one with n inputs, associated with the cell C(k) for receiving the logical value of product terms p(k) and outputting the m bits of the next state functions, and a feedback connection to establish the next state.

According to a further aspect of the invention a VLSI circuit for implementing in hardware any synchronous sequential circuit with data inputs and clock input is provided. It represents a special association of the VLSI circuits mentioned above, precisely the VLSI circuit for implementing in hardware any multiple output combinational circuit and the VLSI circuit for implementing in hardware any synchronous sequential circuit with clock input only.

According to still another aspect of the invention an expert system for analysing and interpreting the logical behaviour of digital circuits, given by input variables, outputs and logical equations in form of sum-of-products is provided, where analysing and interpreting means to validate the input variables and the outputs, to analyse the syntactic correctness of logical equations, to generate for every product term the mask word, the product word and the function word and to transform the individual lists, generated for each product term in a single memory list defining the logical behaviour of a digital circuit and storing it in a database.

According to still another aspect of the invention a method for dynamically configuring the logical behaviour of a VLSI circuit is provided by performing the steps of inputting the input variables, the outputs and a plurality of sum-of-product equations, which describe the logical behaviour of a digital circuit, generating three memory words uniquely defining each product term of the equations and storing the mask word, the product word, and the function word into a corresponding register associated with a cell C(k).

Advantageously, using a fixed hardware structure, the invention provides a mechanism for implementing a large number of VLSI digital circuits having each one a specified logical behaviour. This logical behaviour can be dynamically changed, without replacing the physical structure and/or without using any programming task. One basic cell with a particular physical structure is provided for implementing one product term of any combinational or synchronous sequential digital circuit. For changing the functions performed by the circuit, a set of weights uniquely defining the desired circuitry functions are calculated with high accuracy by an expert system and loaded in the registers of the basic cells. No testing of the logical structure realised with the VLSI circuit is necessary, and this significantly reduces manufacturing costs.

The "Summary of the Invention" does not necessarily disclose all the inventive features. The invention may reside in a sub-combination of the disclosed features.

BRIEF DESCRIPTION OF THE DRAWINGS

The invention will be now explained by way of example only and with reference to the following drawings, wherein similar references are used in different figures to denote similar components.

DETAILED DESCRIPTION OF THE PREFERRED EMBODIMENTS

Figure 1:
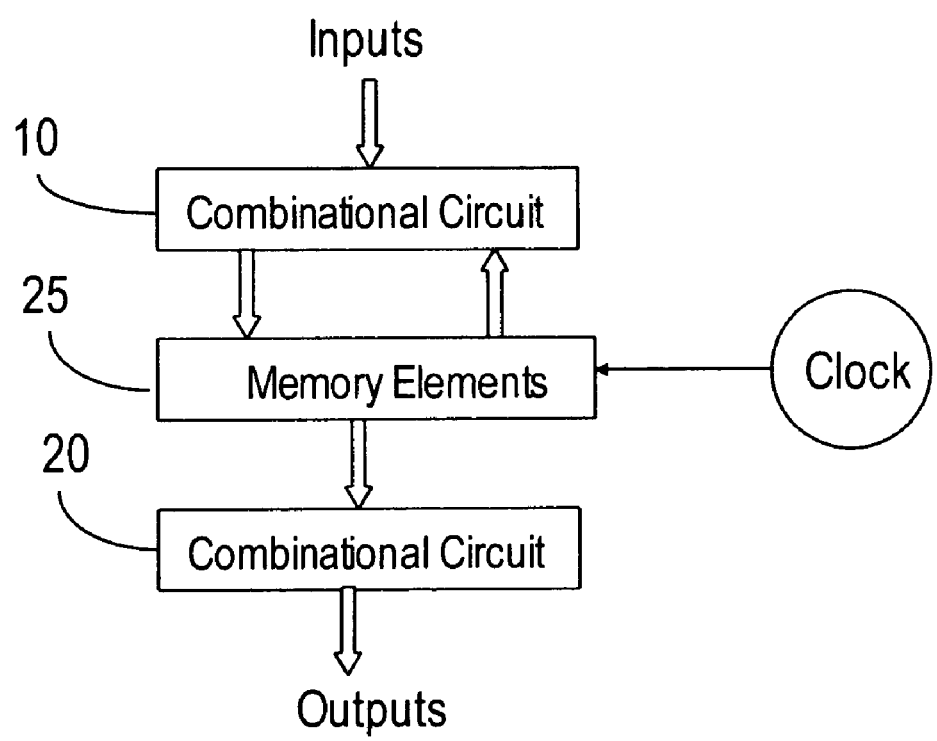
FIG. 1 shows the Moore machine model for synchronous sequential circuits (prior art)

The following description is of preferred embodiments by way of example only and without limitation to combination of features necessary for carrying the invention into effect.

The present invention proposes a novel solution for implementing a combinational and/or synchronous sequential digital circuit, having a one and only one physical structure and able to implement a variety of sum-of-product functions. The method according to the invention is called the product terms method. More precisely it implements in hardware the general pattern of the sum-of-product form of a set of logical equations defining a multiple output combinational circuit, or the general pattern of the sum-of-product form of several sets of logical equations defining a synchronous sequential circuit. This is contrasting with the prior art solution, which uses direct implementation of equations by gates, to designate each logical circuit. To minimize the number of required gates of the circuit, it is recommended that the number of product terms in logical equations describing the behaviour of any multiple output combinational circuit and/or synchronous sequential circuit, be kept to a minimum. The minimization process is outside the scope of the present invention.

Let's consider the logical equations in the form of sum-of-products, that describes the behaviour of a combinational circuit. First, the input variables and the outputs, are placed in succession on virtual registers, and this placement attaches to each of them a weight that has a value expressed as a power of 2 starting with $2^0$ (right alignment). Second, analysing successively all product terms, a table is generated. To construct this table, each product term provides information through three memory words. The first, called the mask word, corresponds to the sum of the weights of input variables representing a product term. Next, the product word represents the sum of the weights of the variables of a product term that give a value of logic 1 to the analysed product term. The third, called the function word, represents the sum of the output weights where a product term has a value of logic 1.

Using this numerical weights, it can be realised an indirect manipulation of the input variables, product terms and outputs. Because each product term may have a logical value of 1 or 0, in order to find this value for a set of given input variables, the method uses the following steps: an AND masking with the mask word to extract the variables of a product term, followed by a comparison operation with the product word to determine its real value, 1 or 0. Finally, because a product term may be present in several equations, the function word of an active product term (its logical value is 1) is ORed with function words of other actives product terms to determine the outputs. Since the general sum-of-products form of logical equations is similar for a large diversity of circuits, one fixed hardware structure can be used for all circuits having this similar form of equations.

The first example relates to a multiple output combinational circuit, where the product terms method is used to obtain the outputs associated with the input variables, and with the words defining the logical equations. It is to be understood that the values of the words are taken by way of example, for explaining how the functions are represented. In this first example the words have 8 bits (a byte). It is to be understood that the size of the word is selected according to the application.

The input variables (also called inputs) are denoted with a, b, c and d, and the output functions (also called outputs), with X, Y, and Z. The inputs are right aligned and "packaged" into an input word "I", while the outputs are right aligned and "packaged" into an output word "O", each word having 8 bits (a byte). The non-occupied places in each word are filled with the bit 0 and, for simplicity, their contribution to the sum of weights (always 0), will be ignored.

This can be shown as below:

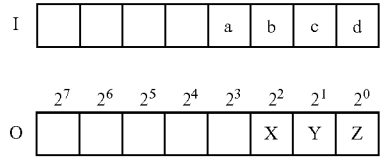

Let's assume that for this first example a multiple output combinational circuit is characterized by the following sum-of-products equations, which give the outputs X, Y, and Z as a combination of inputs a, b, c and d:

$$X = a \cdot b + c \cdot d,$$

$$Y = a \cdot b + \bar{c} \cdot d, \text{ and}$$

$$Z = \bar{a} \cdot \bar{b} \cdot \bar{c} + a \cdot b + \bar{c} \cdot \bar{d} \quad (1)$$

The functions comprise in this example five different product terms, namely $a \cdot b$; $c \cdot d$; $\bar{c} \cdot d$; $\bar{a} \cdot \bar{b} \cdot \bar{c}$; and $\bar{c} \cdot \bar{d}$. Each mask word is determined by the sum of the weights of input variables that compose a product term. The mask words are therefore, for the above example:

Mask word for the product term $a \cdot b = 2^3 + 2^2 = 12$

Mask word for the product term $c \cdot d = 2^1 + 2^0 = 3$

Mask word for the product term $\bar{c} \cdot d = 2^1 + 2^0 = 3$

Mask word for the product term $\bar{a} \cdot \bar{b} \cdot \bar{c} = 2^3 + 2^1 + 2^0 = 14$ Mask word for the product term $\bar{c} \cdot \bar{d} = 2^1 + 2^0 = 3$ (2)

Each product word represents the sum of the weights of the input variables that give a logical value 1 for the analysed product term. The product words are therefore, for the above example:

Product word for the product term $a \cdot b = 2^3 + 2^2 = 12$

Product word for the product term $c \cdot d = 2^1 + 2^0 = 3$

Product word for the product term $\bar{c} \cdot d = 2^0 = 1$

Product word for the product term $\bar{a} \cdot \bar{b} \cdot \bar{c} = 0$

Product word for the product term $\bar{c} \cdot \bar{d} = 0$ (3)

The function word indicates the contribution of the product term into the outputs. For example, $a \cdot b$ is a product term that can give the logical value 1 to the output X, which has range $2^2$ in the output word. The same product term $a \cdot b$ can give the logical value 1 to output Y, which has range $2^1$ in the output word and can give the logical value 1 to output Z, which has range $2^0$. The function words are therefore, for the above example:

Function word for the product term $a \cdot b = 2^2 + 2^1 + 2^0 = 7$

Function word for the product term $c \cdot d = 2^2 = 4$

Function word for the product term $\bar{c} \cdot d = 2^1 = 2$

Function word for the product term $\bar{a} \cdot \bar{b} \cdot \bar{c} = 2^0 = 1$ Function word for the product term $\bar{c} \cdot \bar{d} = 2^0 = 1$ (4)

The individual values Of all these words are summarized in Table 1.

TABLE 1

| Product Term | Mask word | Product word | Function word |
|---|---|---|---|
| a · b | 12 | 12 | 7 |
| c · d | 3 | 3 | 4 |
| $\bar{c}$ · d | 3 | 1 | 2 |
| $\bar{a}$ · $\bar{b}$ · $\bar{c}$ | 14 | 0 | 1 |
| $\bar{c}$ · $\bar{d}$ | 3 | 0 | 1 |

Finally, each product term is associated with the respective mask, product and function values to form a single memory list, as in Table 2 below.

TABLE 2

| a·b | c·d | $\bar{c}$·d | $\bar{a}$·$\bar{b}$·$\bar{c}$ | $\bar{c}$·$\bar{d}$ |
|---|---|---|---|---|
| 12, 12, 7, | 3, 3, 4, | 3, 1, 2 | 14, 0, 1, | 3, 0, 1 |

Figure 2A:
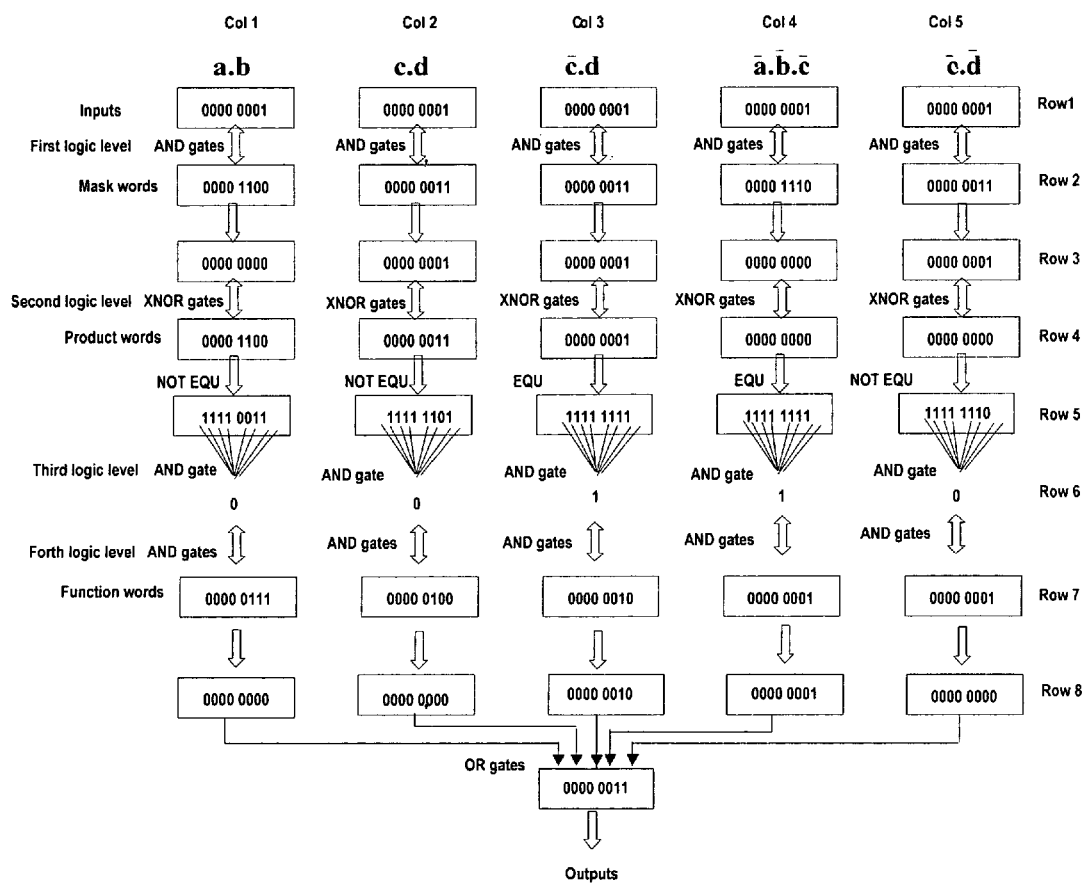
FIG. 2A is a first example of how the mask word, product word and function word are applied to the input variables to provide the outputs, according to the invention.

FIG. 2A shows how the mask words, product words and function words are applied to the associated inputs to provide the outputs for a first numerical example. The bi-directional arrows indicate logical operations between the bits, while a unidirectional arrow shows the result of logical operations. In this example, the logical functions (1) and the input byte "IN=01h" are considered (h means hexadecimal, therefore IN=0000 0001 in binary, namely a =0, b=0, c=0, and d=1). The output value in this case is "OUT=03h", because:

$$X = 0 + 0 = 0$$

$$Y = 0 + 1 = 1$$

$$Z = 1 + 0 + 0 = 1 \quad (5)$$

The columns Col. 1 to Col 5 show the operations over each product term a·b, c·d, $\overline{c \cdot d}$, $\overline{a \cdot b \cdot c}$ and $\overline{c} \cdot d$.

The first row, Row 1, shows the inputs and the second row, Row 2, shows the mask words as given by Table 1. The first intermediate results are shown in Row 3. These intermediate results are obtained by bit by bit AND operation (logical multiplication) between the inputs and the respective mask word.

Row 4 shows the product words associated with each product term, as given in Table 1. The second intermediate results are shown in Row 5. These intermediate results are obtained by EQUIVALENCE operations, which gives logic 1 when both bits are identical (i.e. both are logic 0 or logic 1) and gives a logical 0 when the bits are different, i.e. one is logic 0 and the other is logic 1 (EQUIVALENCE and $\overline{XOR}$ express the same logical operation).

Row 6 show AND operations between all the bits find in a colon at the place of second intermediate results (Row 5), to determine if for the considered values of inputs, the considered product term has a logic value of 1 or 0. All the functions words of Row 7, for which the product term has the logic value of 1, therefore the Row 6 indicate the logical 1, are OR-ed to obtain the final result at outputs.

When maintaining the same number of inputs and same number of outputs, any change in the logical equations requires only a change of the values in the table without changing the physical structure of the VLSI circuit. The new tables provide the logical behaviour for the new circuit.

Suppose, that the name and the number of input variables, e.g. a, b, c, d, and outputs, e.g. X, Y, Z, are not changed and the following new equations are considered:

$$X = a \cdot b + c \cdot d,$$

$$Y = a \cdot b + c \cdot \overline{d}, \text{ and}$$

$$Z = \overline{a} \cdot \overline{b} \cdot c + a \cdot b + \overline{c} \cdot d, \quad (6)$$

Table 3, reflecting the circuit behaviour, is constructed as Table 2 above.

TABLE 3

| a·b | c·d | c·$\overline{d}$ | $\overline{a}$·$\overline{b}$·c | $\overline{c}$·d |
|---|---|---|---|---|
| 12, 12, 7, | 3, 3, 4, | 3, 2, 2 | 14, 2, 1, | 3, 1, 1 |

For this second example, when the input "IN=01h" the output is, if we calculate the function (6):

$$X = 0 + 0 = 0$$

$$Y = 0 + 0 = 0$$

$$Z = 0 + 0 + 1 = 1 \quad (7)$$

Figure 2B:
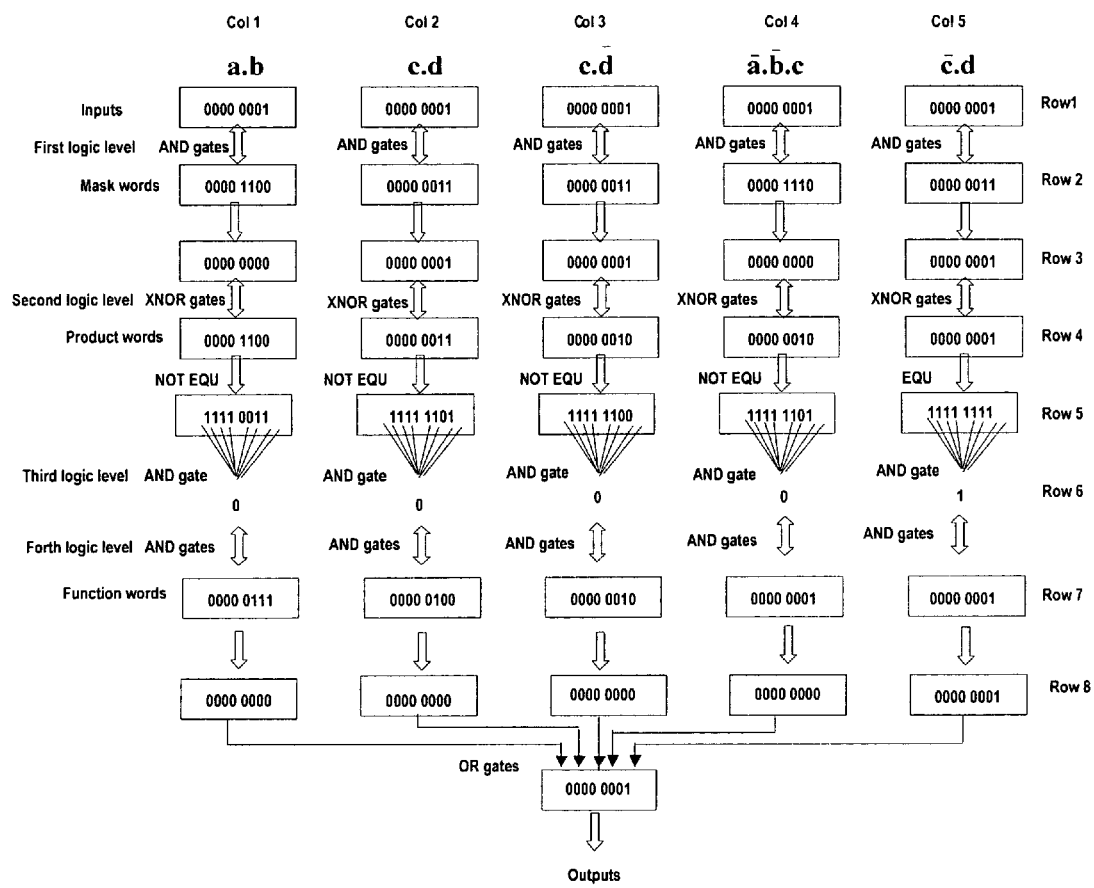
FIG. 2B shows another example, for illustrating the method of the invention.

FIG. 2B shows how the mask words, product words and function words are applied to the associated inputs to provide the outputs for a second numerical example, according to equations (6).

Thus, the advantage of the product terms method is the use of one and only one hardware structure to simulate/implement a large number of combinational circuits, in which each circuit has its own table specifying its logical behaviour.

Figure 3:
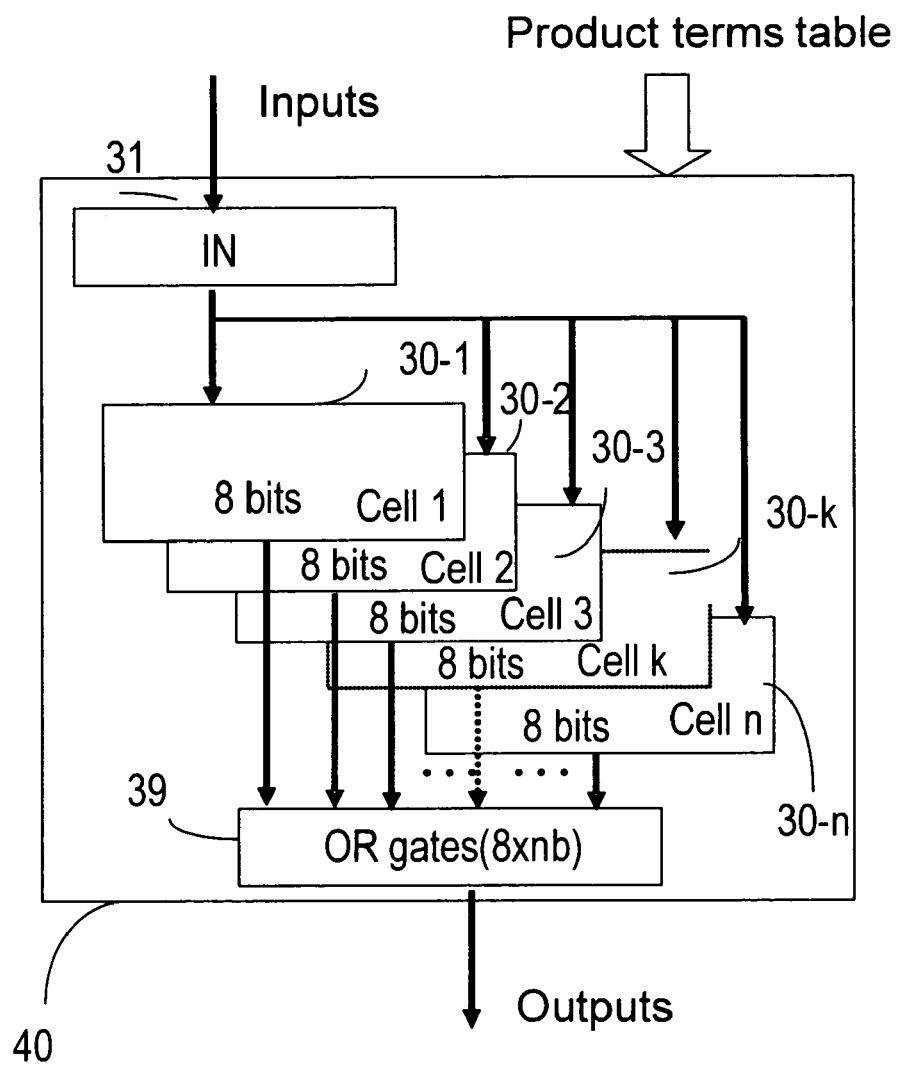
FIG. 3 shows the structure of a VLSI circuit for implementing a plurality of combinational circuits.
Figure 4:
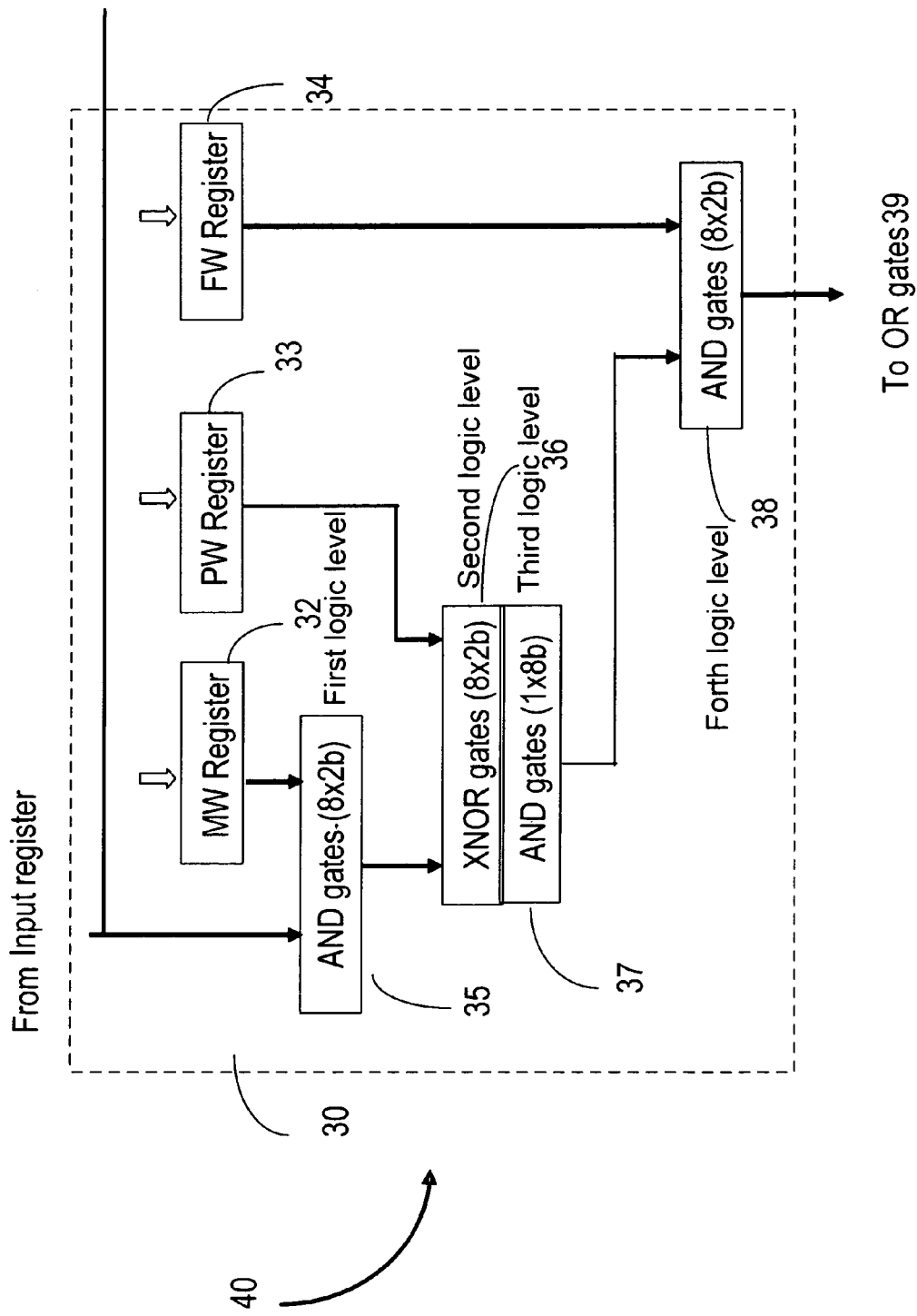
FIG. 4 shows the structure of a 8 bits basic cell.

The invention will be described in connection with FIGS. 3 and 4. FIG. 3 shows the structure of a VLSI circuit 40 for implementing a plurality of multiple output combinational circuits, according to the invention. FIG. 4 illustrates an eight bit basic cell 30. A basic cell, as in FIG. 4, is needed for each product term appearing in the logical equations. The succession of the operations executed by the VLSI circuit 40, of FIG. 3, including the basic cell of FIG. 4, will be explained in conjunction with the numerical example presented in FIG. 2A, for the product term "a.b" shown in the first column (Col 1). For the general case, we denote by "k" the index of a cell 30-k, where "k" takes values between 1 and "n".

As discussed in connection with FIG. 2A, the mask words, product words and function words for a certain multiple output combinational circuit (here the logical equations given by (1)) are predetermined in software using an expert system as it will be later explained. The words, which characterize a product term, in this example a.b, are placed in registers 32, 33 and 34, respectively. As given by Table 1, the mask word for Col. 1 is 12 (binary 0000 1100); the product word is 12 (binary 0000 1100): and the function word is 7 (binary 0000 0111). In the same time, the input variables (binary 0000 0001 in this example) are placed in the IN (input) register 31.

The input variables are AND-ed with the mask word using AND gates 35. Because in this example the words have 8 bits, eight 2 inputs AND gates are needed, each one for implementing the AND operation between a bit of the input with a corresponding (in range) bit of the mask word.

The first intermediate result of this operation is shown in Col. 1, Row 3, of FIG. 2A, and it is 0000 0000. Next, the logical value of the product term (1 or 0) is determined by a comparison operation (bit by bit) between the product word 0000 1100 and the intermediate result obtained above, As indicated, this comparison operation uses EQUIVALENCE gates 36, marked with $\overline{XOR}$ on FIG. 4. Each EQUIVALENCE gate has two inputs, one for a bit of the product word and one for the corresponding bit of the first intermediate result. The outputs of the EQUIVALENCE gates, i.e. the second intermediate result is 111 0011.

The logical value of the product term is then determined by AND-ing the 8 bits of the comparison result using the unique 8 inputs AND gate 37. If the output of this gate is at logical 1, it means that for the input variables considered, the corresponding product term is active and thus it has the logical value 1 in all equations where it is present. In Col 1 of the considered example, the output of the AND gate 37, for the product term a.b and the input IN=01h, has the logical value 0, and therefore the contribution of this product term is 0 to all equations where is present. If the output of AND gate 37 is 1, like that corresponding to the product terms find in Col 3 and in Col 4 in the considered example, this signal opens the eight 2 inputs AND gates 38, permitting to the corresponding function words to be OR-ed in the OR gates 39, to determine the circuit outputs. There is only one group of OR gates for the VLSI circuit 40 of FIG. 3, each gate having "n" inputs, where "n" expresses its maxim capacity in number of basic cells. If, for a specified VLSI circuit 40, "n" becomes very large, the final OR gates may be realised in a multi-level solution.

The gates in all cells 30-k act as a filter between the information that characterize the product terms and the outputs, for implementing in parallel the product terms method. It must be noted that the input register 31 and the OR gates 39 are not part of the basic cell 30.

At the initialisation level the (3n) registers in the "n" basic cells are charged with the information that corresponds to "n" product terms, from a table like Table 2 generated by an expert system according to selected logical equations. When changing that information, the logical behaviour of the VLSI circuit 40 changes accordingly, but the physical structure of the VLSI circuit 40 remains unchanged.

To successfully implement a plurality of functions on a VLSI circuit 40, and to allow flexibility in changing the functions as needed, the total number "n" of basic cells 30 must be increased as much as permitted by the available technology.

For example, a VLSI circuit 40 having 8 inputs, 8 outputs and n=100 basic cells, therefore (3×100+1) registers, can implement any combinational circuit with no more than 8 inputs, and with no more than 8 outputs and with no more than "n" product terms. A non-exhaustive list of these types of combinational circuits is presented below. The number of product terms was approximated for some of the circuits.

Two 2 to 4 binary decoders (4 inputs, 8 outputs, 8 product terms).

One 3 to 8 binary decoder (3 inputs, 8 outputs, 8 product terms).

One 8 to 3 binary priority encoder (8 inputs, 3 outputs, 9 product terms).

One 4 bits comparator (5 inputs, 3 outputs, 46 product terms).

One 4 to 1 multiplexer (6 inputs, 1 outputs, 4 product terms).

Two 2 to 4 demultiplexers (6 inputs, 8 outputs, 8 product terms).

One 3 to 8 demultiplexer (4 inputs, 8 outputs, 8 product terms).

One 4 bits fast binary parallel adder (8 inputs, 5 outputs, approximately 80 product terms).

One 2 digits BCD parallel adder (8 inputs, 8 outputs, approximately 80 product terms).

One 4 bits integer multiplier (8 inputs, 8 outputs, approximately 90 product terms).

One 2 digits BCD multiplier (8 inputs, 8 outputs, approximately 90 product terms).

One 1 digit code converter BCD to 7 segments (4 inputs, 7 outputs, 16 product terms).

As mentioned before, all registers 32, 33 and 34 that are not used for a certain application are loaded with logic 0 at the initialisation level. Evidently, a VLSI circuit 40 having (3n+1) registers, cannot implement functions with more than "n" product terms.

Figure 5:
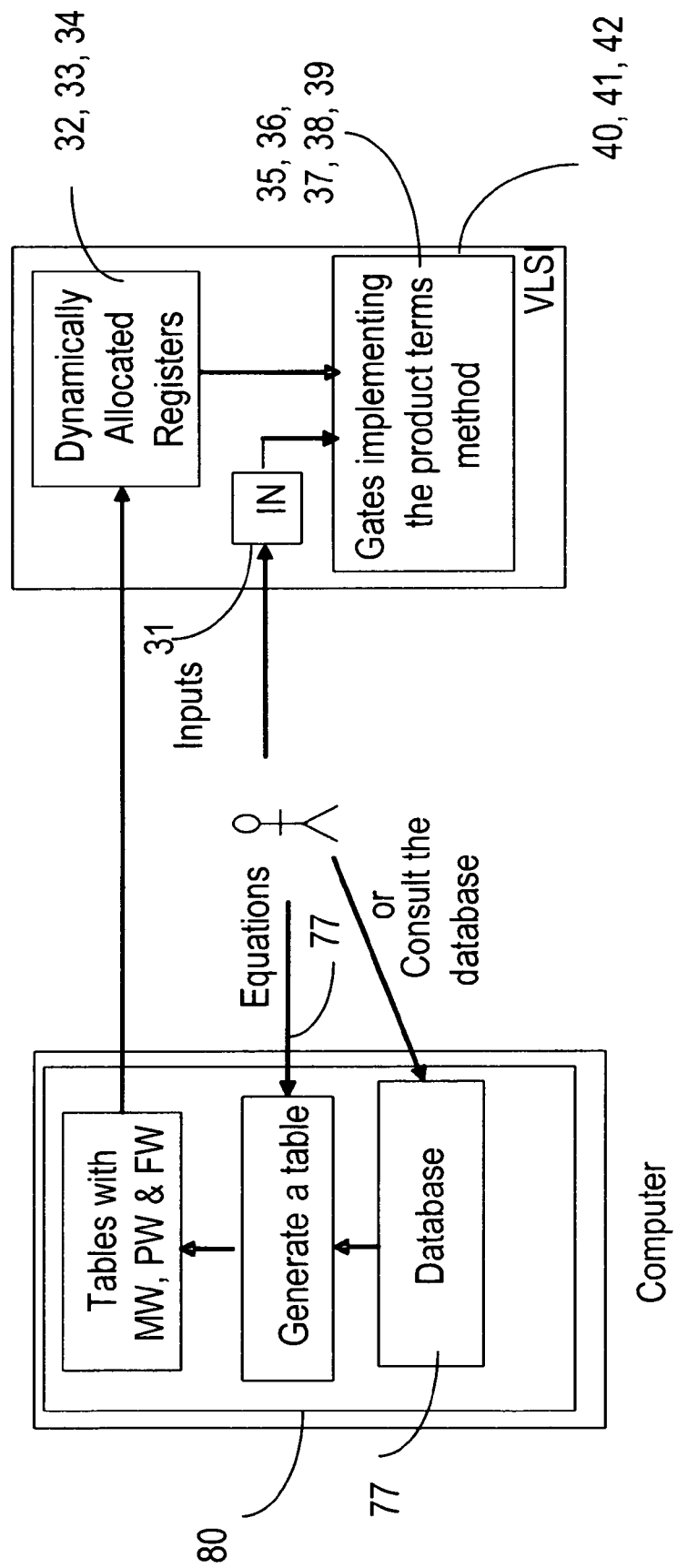
FIG. 5 is a block diagram of the system used for configuring the VLSI circuit of FIG. 3.

The VLSI circuit 40 can be configured in an environment, which has a very simple processor, or a typical personal computer (PC) such as PCs manufactured by IBM Company, Apple Company, or any other manufacturer. A block diagram of such a system is shown in FIG. 5. The user interrogates an expert system 80, which gives him the possibility either to introduce the logical equations 79 or to consult a database 77, where these equations are stored. The expert system generate one or several tables containing words (mask words (MW), product words (PW) and function words (FW)), which characterize the circuit behaviour, and which are charged dynamically in the registers of type 32, 33 and 34 belonging to the VLSI circuit 40. Next, the user introduces or modifies the inputs 78. Any time when the user modifies the logical equations 79 he modifies the logical behaviour of the circuit, and any time when he modifies the inputs 78 the VLSI circuit 40 produces new outputs for the selected circuit. A control program can replace the human user and, therefore, the process of dynamically changing the logical behaviour of any circuit can be performed automatically. There are two major solutions to realise physically the VLSI circuit 40. First, the registers of the VLSI circuit 40 are of type random access memory (RAM) and in this case the VLSI circuit 40 must be permanently tie up to computer to have the possibility of frequently changing its logical behaviour. Second, the registers of the VLSI circuit 40 are of type programmable read only memory (PROM) or re-programmable read only memory (REPROM) and in this case, previously a logical behaviour established, the VLSI circuit 40 can be removed (like a FPGA programmable logic devises) and can be used to implement a specific task. Eventually, it is reprogrammed later, when its logical behaviour must be changed. An arrangement as in FIG. 5, with minor modifications, can also be used for sequential implementations of the product terms method of the invention, for multiple output combinational or synchronous sequential circuits, using software.

Figure 6:
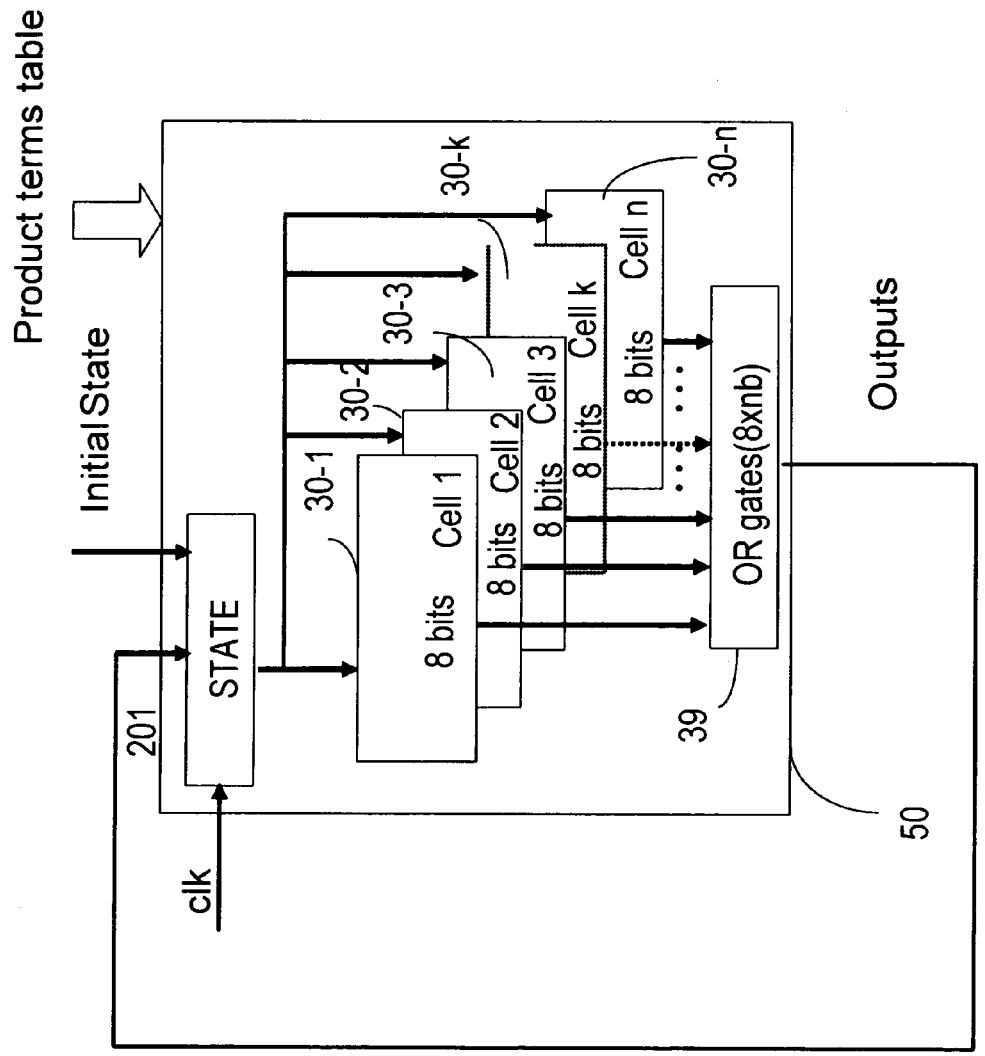
FIG. 6 shows the structure of a VLSI circuit for a plurality of synchronous sequential circuits with clock input and outputs from the state register.

FIG. 6 shows the structure of a VLSI circuit 50 implementing a plurality of synchronous sequential circuits with clock input only, according to the invention. The VLSI circuit 50 uses the same eight bits basic cell 30 as illustrated in FIG. 4. As mentioned earlier, it will be understood that the invention is no limited to this values for the memory part. This VLSI circuit 50 is very similar to the circuit of FIG. 3, using the state register 201 instead of the input register 31. As shown in FIG. 6 the VLSI circuit 50 needs a clock (clk) input. A feedback 202 generates the next state at every clock input. The outputs of the circuit are taken directly from the outputs of the state register 201 and thus this VLSI circuit 50 has only one combinational circuit, used to determine the next state. Considering these modifications, the synchronous sequential VLSI circuit 50 of FIG. 6 works in a similar manner than that described for the combinational VLSI circuit 40 of FIG. 3.

A VLSI circuit 50 like that presented in FIG. 6, supposed to have n=20 basic cells, thus (3*20+1) registers, can implement any synchronous sequential circuit with only clock input having no more than 8 bits state, and less then 20 product terms in logical equations. A non exhaustive list of these type of synchronous sequential circuits are (the exact number of product terms has not been determined for all circuits):

Any four 2 bits, or two 3 bits, or two 4 bits, or one 5 bits, or one 6 bits, or one 7 bits or one 8 bits direct binary counter (13 product terms for 8 bits counter).

Any four 2 bits, or two 3 bits, or two 4 bits, or one 5 bits, or one 6 bits, or one 7 bits or one 8 bits reverse binary counter (13 product terms for 8 bits counter A two digit BCD direct counter (9 product terms).

A two digit BCD reverse counter (9 product terms).

Any modulo 3, or modulo 5, or modulo 6, or modulo 7, or modulo 9, or modulo 11, or modulo 12, or modulo 13, or modulo 14, or modulo 15 counter.

Any 2 bits, or 3 bits, or 4 bits counter, counting in any numeration system (for example a 4 bits counter which counts in excess 3 code).

Any shift left register with maximum 8 bits.

Any shift right register with maximum 8 bits.

Any left recirculating register with maximum 8 bits.

Any right recirculating register with maximum 8 bits.

Any 3 bits, or 4 bits, or 5 bits, or 6 bits, or 7 bits binary pseudo-random generator.

A minute chronometer (18 product terms).

A dice game (14 product terms).

Figure 7:
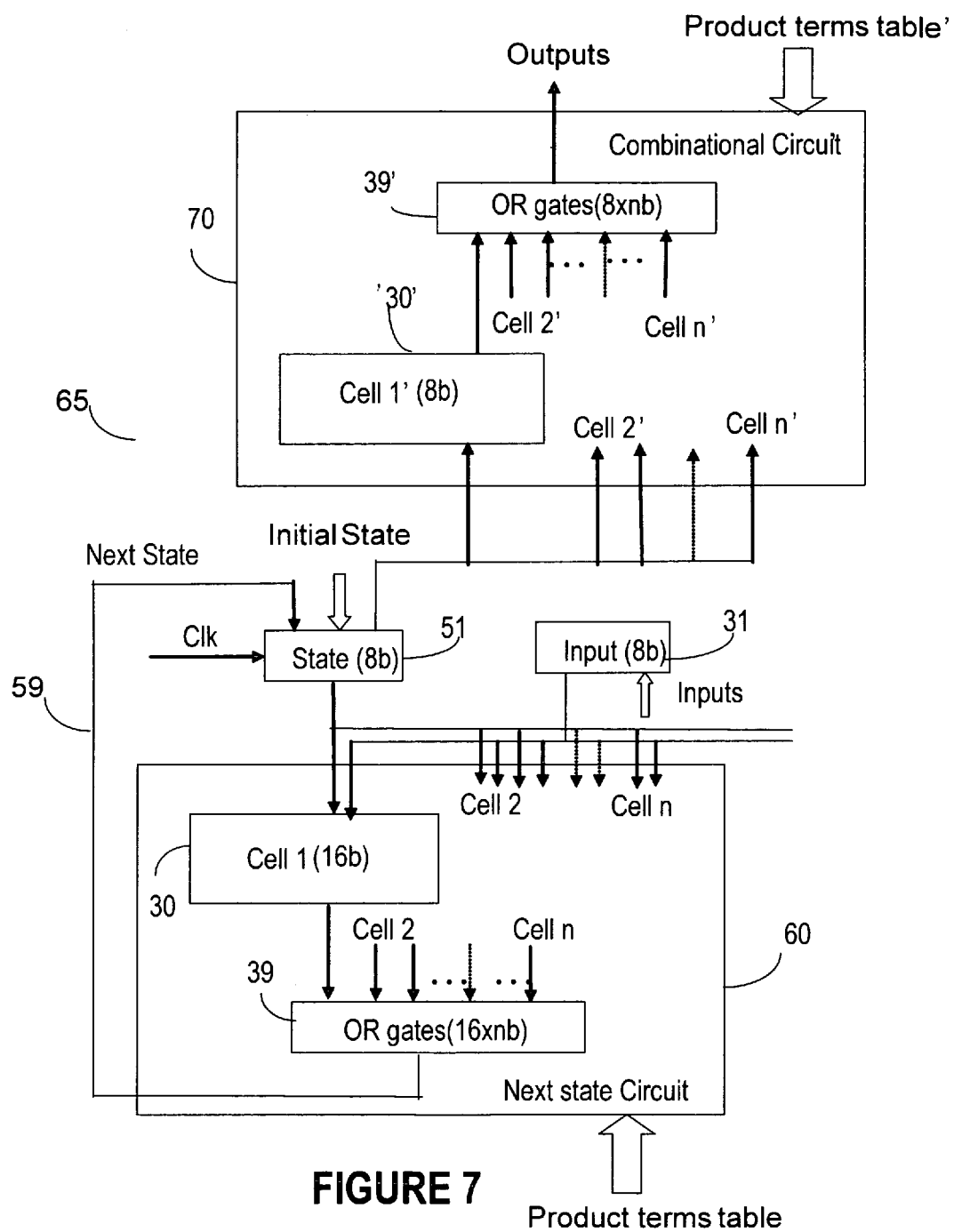
FIG. 7 shows the structure of a VLSI circuit for general Moore machine model, implementing a plurality of synchronous sequential circuits with data inputs and clock input.

FIG. 7 illustrates an example of a general Moore synchronous sequential circuit 65 with two combinational circuits, precisely the Next state circuit 60 and the Combinational circuit' 70 for outputs. Only one cell 30 and one cell 30' are illustrated on each of the combinational circuits 60 and 70 for simplification. It is to be understood that as in the previous examples, the circuit 60 may have a number of "n" basic cells 30 and the circuit 70 may have a number of "n'" basic cells 30' for implementing a structure with "n" product terms in the next state equations, and "n'" product terms in the output equations. Unlike the previous examples, the basic cells 30 of the next state equations operate on 16 bits, but the basic cells 30' of output equations operate on 8 bits. In this example, the input register 31 has a capacity of 8 bits and the state register 61, has also a capacity of 8 bits.

As shown in FIG. 7 the Next state circuit 60 needs a clock (clk) input. The state register 51 receives next state values from the OR-gate 39 on line 59.

The VLSI circuits 40, 50 and 65 presented in these preferred embodiments can be combined to allow passing the information in a way similar to that known inside a classical network composed by several level of gates. When the necessary number of product terms is too large for a given VLSI circuit of type 40, 50 or 65, two or several VSLI circuits of type 40, 50 or 65 may be used and connected in series.

Figure 8:
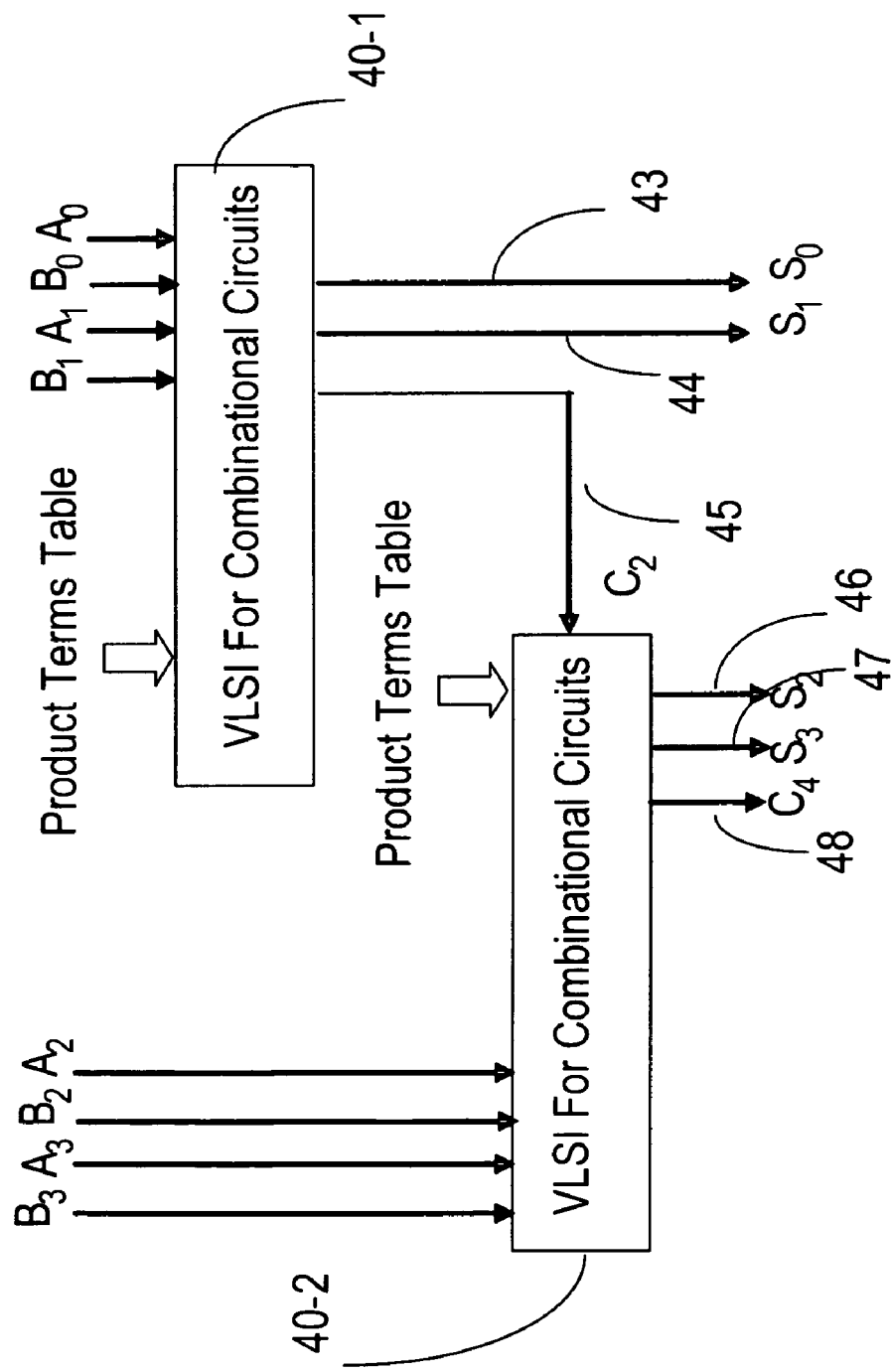
FIG. 8 shows the association of two VLSI circuits to form a 4 bits fast adder.

For example, the VLSI circuit 40 of FIG. 3 (considered with 100 basic cells) used to implement a fast 4 bits binary parallel adder, can be replaced by two VLSI circuits of type 40, precisely 40-1 and 40-2 as shown in FIG. 8. Each VLSI circuit of type 40 of FIG. 8 is similar to the VLSI circuit 40 of FIG. 3. Circuits 40-1 and 40-2 of FIG. 8 has only n=30 basic cells (every 2 bits fast binary adder needs in logical equations 27 product terms). The VLSI circuit 40-1 performs the addition of first two bits, $A_0$ with $B_0$ and $A_1$ with $B_1$, and outputs on lines 43, 44 the bits of sum $S_0$ and $S_1$ and on line 45 the bit of carry $C_2$. The VLSI circuit 40-2 performs the addition of last two bits, $A_2$ with $B_2$ and $A_3$ with $B_3$, and outputs on lines 46, 47 the bits of sum $S_2$ and $S_3$ and on line 48 the bit of carry $C_4$.

Figure 9:
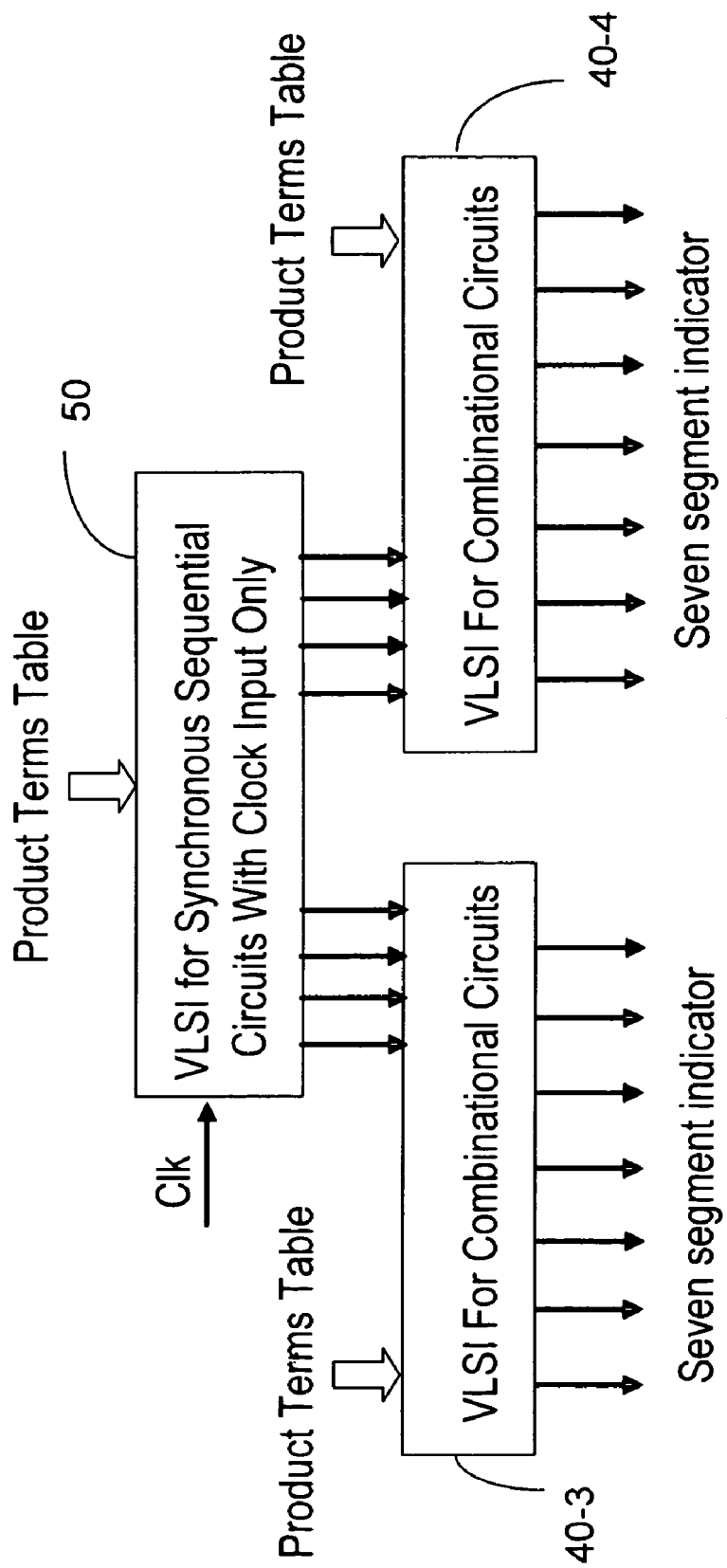
FIG. 9 shows the association of three VLSI circuits to form a structure, which can implement several types of direct and reverse counters, with outputs displayed over a 7-segment indicator.

A second example is presented in FIG. 9, where it was associated a VLSI circuit 50 with two VLSI circuits of type 40, precisely 40-3 and 40-4, to obtain a structure which can implement direct and reverse counters with outputs that use 7 segments display. For this last example, if all three VLSI circuits are implemented in a single chip, the two input registers 31 of the structure specified in FIG. 3 for the VLSI circuits 40, can be omitted because the state register 201 of the VSLI circuit 50 can be used as the input register for the VLSI circuit of type 40.

Finally, we consider that a large number of connected VLSI circuits of the types presented in this invention, can directly execute programs at higher speeds, creating, in this way, a special data flow computer.

A second embodiment of the proposed VLSI device for implementing in hardware any multiple-output combinational target circuit defined by a group of logical sum-of-product equations, considers every single sum-of-products logical equation as an independent equation. Each independent equation needs a maximum of q modified cells C(k), where a modified cell C(k) is used for determining the logical value of a product term p(k) of an independent equation. If the same product term is a component of several independent sum-of-product equations, this product term must be implemented several times in hardware, using a modified cell C(k) for each equation where the product term is there.

Let's assume that for this second embodiment, a multiple output target combinational circuit has the following equation that gives one of the outputs (the same equation as used for Z in (1)):

$$Z = a.b + \bar{a}.\bar{b}.c + \bar{c}.d \qquad (8)$$

Figure 10:
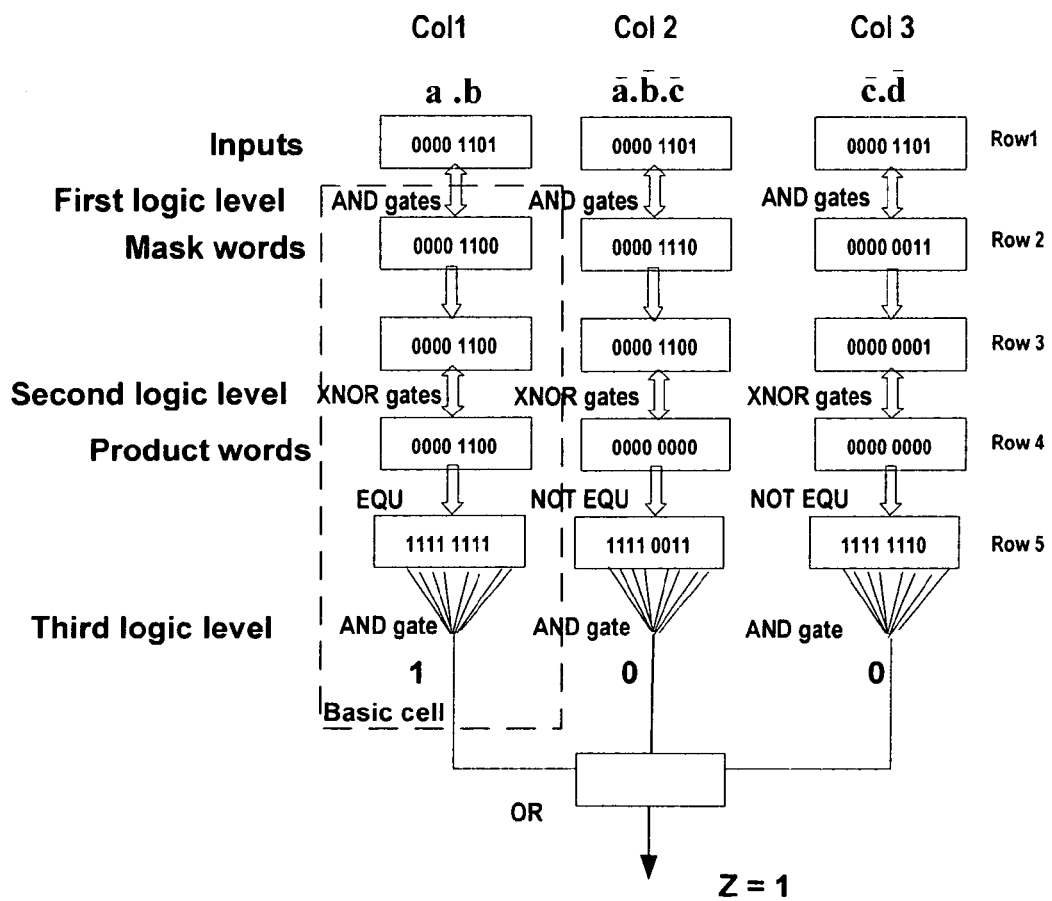
FIG. 10 shows the application of mask words and product words to associated inputs to provide output of the considered independent equation.
Figure 11:
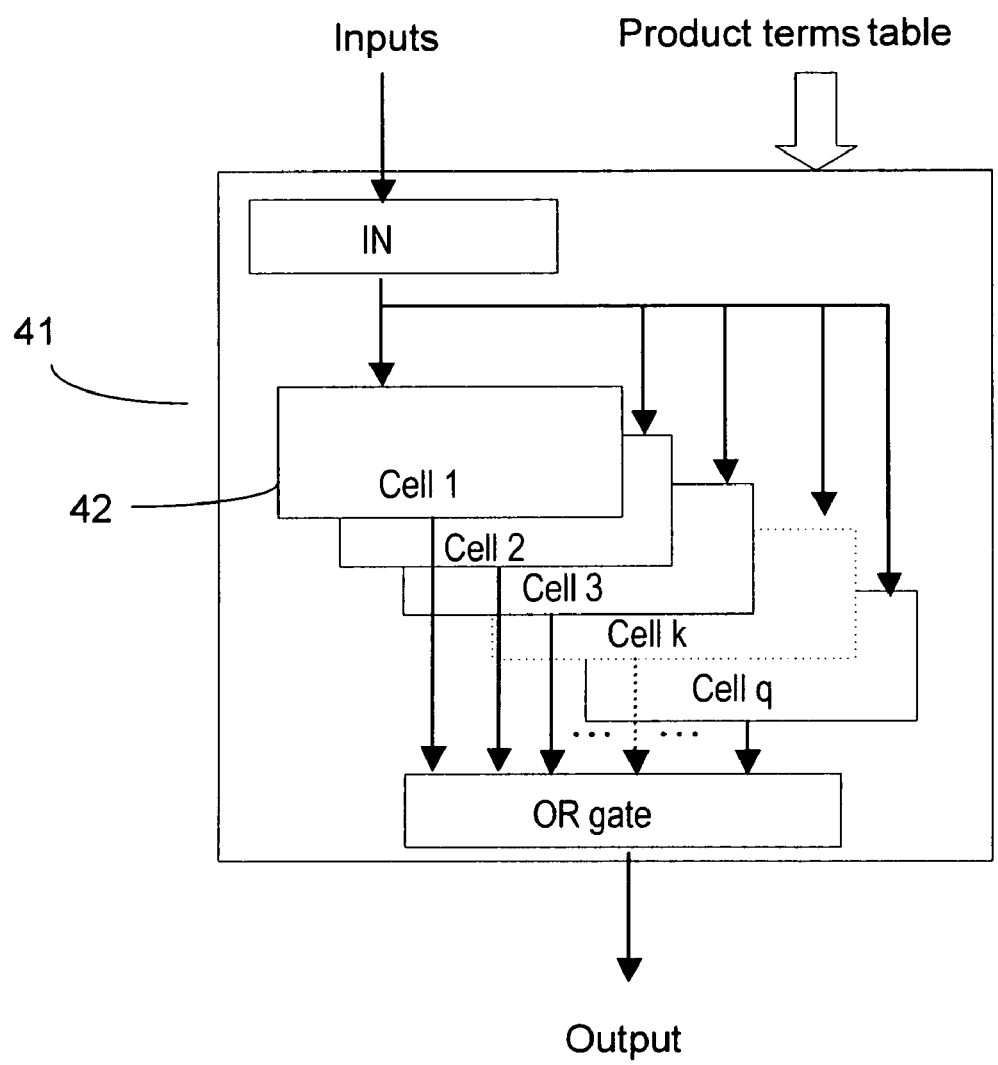
FIG. 11 shows the second embodiment of the VLSI device implementing only the independent equation.
Figure 12:
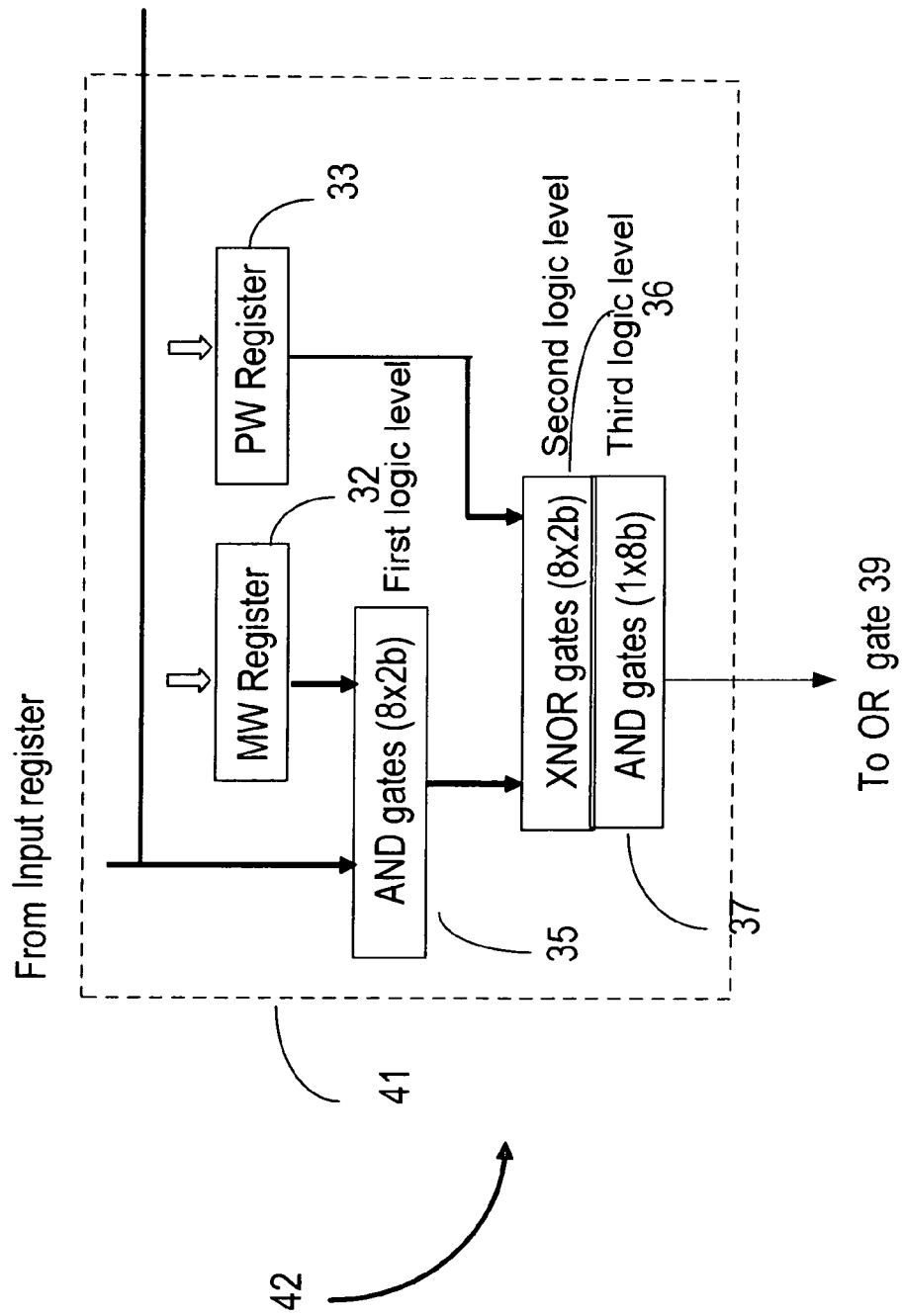
FIG. 12 shows the independent equation using the modified cell with mask word register and product word register connected to the associated combinational part.

FIG. 10 demonstrates how the mask words and the product words are applied to the associated inputs (a=1, b=1, c=0, d=1) to provide the output of the considered independent equation (8). FIG. 11 shows partially the second embodiment of the proposed VLSI device, the structure 41 implementing only the independent equation (8). Each independent equation uses q modified cell C(k) 42, as shows in FIG. 12. The modified cell 42 has only the mask word register 32 and the product word register 33 connected to the associated combinational part, formed by AND gates 35, EQUIVALENCE (XNOR) gates 36, and AND gate 37. In FIG. 11 one and only one final OR gate 39 is used to determine the logical value of the single output of the independent equation. This second embodiment of the proposed VLSI device can be equally used to implement the sum-of-product logical equations that describe the combinational parts of sequential target circuits.

The invention can be implemented in digital electronic circuitry, or in computer hardware, firmware, software, or in combinations thereof. Apparatus of the invention can be implemented in a computer program product tangibly embodied in a machine-readable storage device for execution by a programmable processor: and a programmable processor executing a program of instructions by operating on input data and generating output can perform the actions.

The invention can be implemented advantageously in one or more computer programs that are executable on a programmable system including at least one programmable processor coupled to receive data and instructions from, and to transmit data and instructions to, a data storage system, at least one input device, and at least one output device. Each program can be implemented in a high-level procedural or object oriented programming language, or in assembly or machine language if desired; and in any case, the language can be a compiled or interpreted language.

Suitable processors include, by way of example, both general and special purpose microprocessors. Generally, a processor will receive instructions and data from a read-only memory and/or a random access memory.

Generally, the system will include one or more mass storage devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical The invention provides the hardware structure of several new types of VSLI circuits, having re-configurable logic behaviours. A first embodiment implements any type of multiple output combinational circuit, a second embodiment implements any synchronous sequential circuit with only clock input and, a third embodiment implements any synchronous sequential circuits with data inputs and clock input.

An expert system capable to generate the tables used for the product terms method by interpreting and analysing the logical equations either supplied by the user or found in a database is also provided.

Numerous modifications, variations, and adaptations may be made to the particular embodiments of the invention without departing from the scope of the invention which is defined in the claims.

The invention claimed is:

1. A dynamically reconfigurable VLSI device for implementing in hardware any multiple outputs combinational target circuit having the output functions expressed in logical sum-of-product equations with a maximum of m inputs, a maximum of r outputs and a maximum of n product terms p(k), comprising:
   a register with m bits for storing the input variables;
   n cells, a cell C(k) for determining the logical value of a product term p(k) of said equations for given inputs;
   a block of r OR gates, each one with n inputs, associated with said cells C(k) for receiving the logical value of product terms p(k) and outputting the r bits of output functions;
   wherein said cell C(k) comprises:
   a storage area for storing the information that characterizes a product term, named mask word, product word and function word;
   first logic level means for receiving said m inputs and said mask word to produce a first intermediate result, which identify the input variables that form a product term;

second logic level means for comparing the said product term with said first intermediate result to produce a second intermediate result concerning a product term;

third logic level means for receiving said second intermediate result to produce the logical value of the product term; and forth logic level means for transferring said function word to r outputs, according to said logical value of said product term p(k), and subsequently to be OR-ed with function words of other product terms.

2. A dynamically reconfigurable VLSI device as in claim 1, wherein said storage area of a cell C(k) comprises two m-bit registers and one r-bit register.

3. A dynamically reconfigurable VLSI device as in claim 1, wherein said first logic level of a cell C(k) comprises m*(2-bit) AND gates, each one for receiving a respective bit of said m input variables and of said mask word to produce said first intermediate result.

4. A dynamically reconfigurable VLSI device as in claim 1, wherein said second logic level of a cell C(k) comprises m*(2-bit) XNOR gates, each one for receiving a respective bit of said first intermediate result and of said product word to produce a bit of said second intermediate result.

5. A dynamically reconfigurable VLSI device as in claim 1, wherein said third logic level of a cell C(k) comprises one m-bit AND gate to produce a logical value which is the value of the product term.

6. A dynamically reconfigurable VLSI device as in claim 1, wherein said forth logic level of a cell C(k) comprises m*(2-bit) AND gates for transferring said function word to outputs, considering the logical value of said product term p(k).

7. A dynamically reconfigurable VLSI device for implementing in hardware a target synchronous sequential circuit with maximum $2^s$ states, clock input only and outputs taken from the state register, wherein the multiple outputs combinational circuit which establish the next state defined by sum-of-product logical equations is implemented according to claim 1, with maximum s inputs, maximum s outputs and maximum n product terms p(k) and wherein the input register is a state register with s bits; and further comprising:

a feedback connection to establish the next state.

8. A dynamically reconfigurable VLSI device for implementing in hardware a target synchronous sequential circuit with maximum $2^s$ states, m data inputs, clock input and r outputs, wherein two multiple outputs combinational circuits are implemented according to claim 1, the first combinational circuit defined by the next state sum-of-product logical equations with maximum (m+s) inputs, maximum s outputs and maximum n1 product terms p(k) and the second combinational circuit defined by the output sum-of-product logical equations, with maximum s inputs, maximum r outputs, and maximum n2 product terms p(k); and further comprising:

a state register with s bits, wherein said state register is the input register of the second combinational circuit;

a feedback connection to establish the next state.

9. A dynamically reconfigurable VLSI device for implementing in hardware any multiple-output combinational target circuit defined by a group of logical sum-of-product equations, with maximum m inputs, maximum r outputs and a maximum of q product terms in each equation, having a register with m bits for storing the input variables and for each single sum-of-products logical equation, considered as an independent equation, further comprising:

q modified cells, a modified cell C(k) for determining the logical value of a product term p(k) of said independent equation, for given inputs;

a single OR gate associated with said q modified cell C(k) for receiving the logical value of product terms p(k) to provide a single output for said independent equation;

wherein said modified cell C(k) comprises:

a storage area formed by two m-bit registers for storing the information that characterizes a product term, named mask word and product word;

first logic level that comprises m*(2-bit) AND gates, each one for receiving a respective bit of said inputs and of said mask word to produce a respective bit of first intermediate result, which identify the input variables that form a product term;

second logic level that comprises m*(2-bit) XNOR gates, each one for receiving a respective bit of said product word and said first intermediate result to produce a second intermediate result concerning a product term; and third logic level that comprises one m-bit AND gate for receiving the m bits of said second intermediate result to produce a logical value which is the value of the product term.

10. A dynamically reconfigurable VLSI device for implementing in hardware a target synchronous sequential circuit with maximum $2^s$ states, clock input only and outputs taken from the state register, wherein the multiple outputs combinational circuit which establish the next state defined by sum-of-product logical equations is implemented according to claim 9, with maximum s inputs, maximum s outputs and maximum q product terms p(k) in each said equation and wherein the input register is a state register with s bits; and further comprising:

a feedback connection to establish the next state.

11. A dynamically reconfigurable VLSI device for implementing in hardware a target synchronous sequential circuit with maximum $2^s$ states, m data inputs, clock input and r outputs, wherein two multiple outputs combinational circuits are implemented according to claim 9, the first combinational circuit defined by the next state, sum-of-product logical equations with maximum (m+s) inputs, maximum s outputs and maximum q1 product terms p(k) in each said next state equation, and the second combinational circuit defined by the output sum-of-product logical equations, with maximum s inputs, maximum r outputs and maximum q2 product terms p(k) in each said output equation; and further comprising:

a state register with s bits, wherein said state register is the input register of the second combinational circuit;

a feedback connection to establish the next state.

12. A method for implementing target circuits selected from multiple-output combinational circuits and from synchronous sequential circuits, having their behavior described by groups of logical sum-of-product equations, wherein each said group of logical sum-of-product equations is implemented in a dynamically reconfigurable VLSI device, as in claim 1 or 9, the method comprising the steps of:

inputting a request to reconfigure said VLSI device to said target circuit;

identifying the VLSI device to be configured, considering its internal structure, of type cell C(k) or of type modified cell C(k);

generating memory words uniquely defining each product term p(k) of said sum-of-products logical equations; and implementing the target circuit by storing said memory words into a corresponding registers of type cell C(k) or of type modified cell C(k).

* * * * *